United States Patent
Naba et al.

(10) Patent No.: US 10,872,841 B2
(45) Date of Patent: Dec. 22, 2020

(54) CERAMIC METAL CIRCUIT BOARD AND SEMICONDUCTOR DEVICE USING THE SAME

(71) Applicants: KABUSHIKI KAISHA TOSHIBA, Tokyo (JP); TOSHIBA MATERIALS CO., LTD., Yokohama (JP)

(72) Inventors: Takayuki Naba, Chigasaki Kanagawa (JP); Hiromasa Kato, Nagareyama Chiba (JP); Noboru Kitamori, Miura Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 15/742,829

(22) PCT Filed: Jun. 1, 2016

(86) PCT No.: PCT/JP2016/066280
§ 371 (c)(1),
(2) Date: Jan. 8, 2018

(87) PCT Pub. No.: WO2017/006661
PCT Pub. Date: Jan. 12, 2017

(65) Prior Publication Data
US 2018/0190568 A1    Jul. 5, 2018

(30) Foreign Application Priority Data
Jul. 9, 2015 (JP) .................................. 2015-138036

(51) Int. Cl.
*H01L 23/373* (2006.01)
*C04B 37/02* (2006.01)
(Continued)

(52) U.S. Cl.
CPC ........ *H01L 23/3735* (2013.01); *C04B 37/026* (2013.01); *H01L 23/492* (2013.01);
(Continued)

(58) Field of Classification Search
CPC . H01L 23/3735; H01L 21/1882; H01L 23/12; H01L 23/15
See application file for complete search history.

(56) References Cited

U.S. PATENT DOCUMENTS 6,261,703 B1    7/2001 Sasaki et al.
9,764,416 B2 *  9/2017 Nagase ............... H01L 23/3735
(Continued)

FOREIGN PATENT DOCUMENTS

CN    204067362 U    12/2014
EP    1298968 A2     4/2003
(Continued)

OTHER PUBLICATIONS

International Search Report (in English and Japanese) and Written Opinion (in Japanese) issued in PCT/JP2016/066280, dated Jul. 19, 2016; ISA/JP.
(Continued)

*Primary Examiner* — Zandra V Smith
*Assistant Examiner* — Andre C Stevenson
(74) *Attorney, Agent, or Firm* — Harness, Dickey & Pierce, P.L.C.

(57) ABSTRACT

The present invention provides a ceramic metal circuit board including a ceramic substrate and metal plates bonded to both surfaces of the ceramic substrate through respective bonding layers, wherein a metal film is provided on a surface of one metal plate bonded to one surface of the ceramic substrate; and at least a part of another metal plate bonded to another surface of the ceramic substrate is not provided with the metal film. Preferably, a protruding portion is
(Continued)

formed as a portion of the bonding layer so as to protrude from a side surface of each of the metal plates. According to the above-described configuration, it is possible to provide a ceramic circuit board which is easy to use according to the parts to be bonded and is excellent in heat-cycle resistance characteristics.

16 Claims, 5 Drawing Sheets

(51) Int. Cl.
    *H01L 23/492*     (2006.01)
    *H01L 23/498*     (2006.01)
    *H01L 23/00*     (2006.01)
    *H01L 25/065*     (2006.01)
    *H01L 21/48*     (2006.01)
    *H01L 23/15*     (2006.01)
    *H01L 23/367*     (2006.01)

(52) U.S. Cl.
CPC .. *H01L 23/49811* (2013.01); *H01L 23/49838* (2013.01); *H01L 23/49866* (2013.01); *H01L 24/32* (2013.01); *H01L 25/0655* (2013.01); *C04B 2237/121* (2013.01); *C04B 2237/124* (2013.01); *C04B 2237/125* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/704* (2013.01); *C04B 2237/706* (2013.01); *C04B 2237/708* (2013.01); *C04B 2237/72* (2013.01); *C04B 2237/86* (2013.01); *C04B 2237/88* (2013.01); *H01L 21/4882* (2013.01); *H01L 23/15* (2013.01); *H01L 23/3675* (2013.01); *H01L 24/29* (2013.01); *H01L 24/48* (2013.01); *H01L 24/73* (2013.01); *H01L 2224/29111* (2013.01); *H01L 2224/32225* (2013.01); *H01L 2224/32245* (2013.01); *H01L 2224/48227* (2013.01); *H01L 2224/73265* (2013.01); *H01L 2924/00014* (2013.01)

(56) References Cited

U.S. PATENT DOCUMENTS

| | | | |
|---|---|---|---|
| 9,944,565 B2* | 4/2018 | Osanai | C04B 37/02 |
| 2003/0232204 A1 | 12/2003 | Tsukaguchi et al. | |
| 2004/0131832 A1 | 7/2004 | Tsukaguchi et al. | |
| 2004/0262367 A1* | 12/2004 | Nakamura | C04B 37/026 |
| | | | 228/122.1 |
| 2005/0175773 A1 | 8/2005 | Tsukaguchi et al. | |
| 2008/0079021 A1* | 4/2008 | Bayerer | H01L 23/3735 |
| | | | 257/177 |
| 2014/0291699 A1 | 10/2014 | Yano et al. | |
| 2017/0141010 A1* | 5/2017 | Iwazaki | C04B 37/02 |

FOREIGN PATENT DOCUMENTS

| | | |
|---|---|---|
| EP | 1465251 A2 | 10/2004 |
| EP | 1562411 A1 | 8/2005 |
| JP | 2003-031720 A | 1/2003 |
| JP | 2005035874 A | 2/2005 |
| JP | 2005-220412 A | 8/2005 |
| JP | 2009-170930 A | 7/2009 |
| JP | 2014-187180 A | 10/2014 |
| WO | WO-1998-54761 A1 | 12/1998 |
| WO | WO-2013094213 A1 | 6/2013 |
| WO | WO-2015114987 A1 | 8/2015 |

OTHER PUBLICATIONS

International Preliminary Report on Patentability dated Jan. 9, 2018 in corresponding PCT Application No. PCT/JP2016/066280, with English translation.

* cited by examiner

CERAMIC METAL CIRCUIT BOARD AND SEMICONDUCTOR DEVICE USING THE SAME

CROSS REFERENCE TO RELATED APPLICATIONS

This application is a U.S. National Phase Application under 35 U.S.C. 371 of International Application No. PCT/JP2016/066280 filed on Jun. 1, 2016 and published in Japanese as WO 2017/006661 A1 on Jan. 12, 2017. This application is based on and claims the benefit of priority from Japanese Patent Application No. 2015-138036 filed Jul. 9, 2015. The entire disclosures of all of the above applications are incorporated herein by reference.

TECHNICAL FIELD

Embodiments described herein generally relate to a ceramic metal circuit board and a semiconductor device using the same.

BACKGROUND ART

A ceramic metal circuit board is formed by bonding a metal plate onto a ceramic substrate such as an aluminum oxide ($Al_2O_3$) substrate, an aluminum nitride (AlN) substrate, and a silicon nitride ($Si_3N_4$) substrate. As the metal plate, a copper (Cu) plate and/or an aluminum (Al) plate is used.

A bonding method of using a brazing material is widely used for bonding the metal plate onto the ceramic substrate. In this bonding method, a brazing material containing at least one of active metal such as Ti, Zr, Hf, and Si is used. As the brazing material using at least one active metal selected from Ti, Zr, and Hf, a brazing material containing Ag and Cu as main components is exemplified. As a brazing material using Si as an active metal, a brazing material containing Al as a main component can be exemplified.

Such a ceramic metal circuit board is used as a semiconductor device by mounting a semiconductor element onto a metal plate. WO 98/54761 pamphlet (Patent Document 1) discloses an example of a conventional ceramic metal circuit board. In the ceramic metal circuit board disclosed in Patent Document 1, Ni plating is provided so as to cover a metal plate. It is disclosed that heat-cycle resistance characteristics are improved by adopting such a structure and adjusting a thermal expansion coefficient.

PRIOR ART DOCUMENT

Patent Document

Patent Document 1: WO 98/54761 pamphlet

SUMMARY OF THE INVENTION

Problems to be Solved by the Invention

Solder is used for mounting a semiconductor element on a metal plate. In recent years, it is mainstream to use lead-free solder in view of toxicity of lead. As indicated in Japanese Industrial Standard (JIS-Z-3282), lead-free solders such as Sn—Ag type, Sn—Cu type, and Sn—Zn type are used. Although Lead-free solder is satisfactory in terms of wettability with a Ni plating layer, further improvement has not been expected. Thus, there is a limit in further improving reliability of bonding with a semiconductor element.

A metal plate (i.e., rear metal plate), which is bonded to the surface opposite to the mounting surface of a semiconductor element, is bonded to a heat dissipation member (heat radiating member) such as a heat sink and a heat dissipation fin. Metal (including alloys) such as copper and aluminum is mainly used for a constituent material of the heat dissipation member. Grease is used for bonding the rear metal plate to the heat dissipation member.

However, when grease is applied without applying Ni plating on the surface of the metal plate, there is posed a problem that adhesion (close-contacting property) between the rear metal plate and the heat dissipation member deteriorates.

In view of the above-described problem, an object of the present invention is to provide a ceramic metal circuit board having improved bondability of the front metal plate and the rear metal plate even when the parts to be connected and the like are different between the front and rear metal plates.

Means for Solving the Problems

In one embodiment, a ceramic metal circuit board includes: a ceramic substrate; and metal plates bonded to both surfaces of the ceramic substrate through respective bonding layers, wherein a metal film is provided on a surface of one metal plate bonded to one surface of the ceramic substrate; and at least a part of another metal plate bonded to another surface of the ceramic substrate is not provided with the metal film. Preferably, a protruding portion is formed as a portion of the bonding layer so as to protrude from a side surface of each of the metal plates. More preferably, a metal film is provided so as to cover the side surface of each of the metal plates and the protruding portion.

Effect of Invention

In a ceramic metal circuit board according to one embodiment, a metal film is provided on a surface of one metal plate and at least a part of another metal plate is not provided with the metal film. Thus, depending on the parts to be bonded, it is possible to selectively use a front metal plate and a rear metal plate.

In addition, by providing a metal film on the rear metal plate, wettability with grease can be improved. Hence, when the rear metal plate and the heat dissipation member are integrated (bonded) through the grease layer, its heat dissipation property can be improved.

Further, by covering the side surface of the metal plates with respective metal films, it is possible to prevent each bonding layer from reacting with reactive gas. Moreover, by covering the protruding portion of each bonding layer with the metal film, it is also possible to further improve the heat-cycle resistance characteristics (TCT (Thermal Cycle Test) characteristics).

Thus, a highly reliable ceramic metal circuit board and a semiconductor device using the same can be provided.

DESCRIPTION OF EMBODIMENTS

A ceramic metal circuit board according to one embodiment includes a ceramic substrate and metal plates bonded to both surfaces of the ceramic substrate through respective bonding layers, wherein a metal film is provided on a surface of one metal plate bonded to one surface of the ceramic substrate; and at least a part of another metal plate bonded to another surface of the ceramic substrate is not provided with the metal film.

Figure 1:
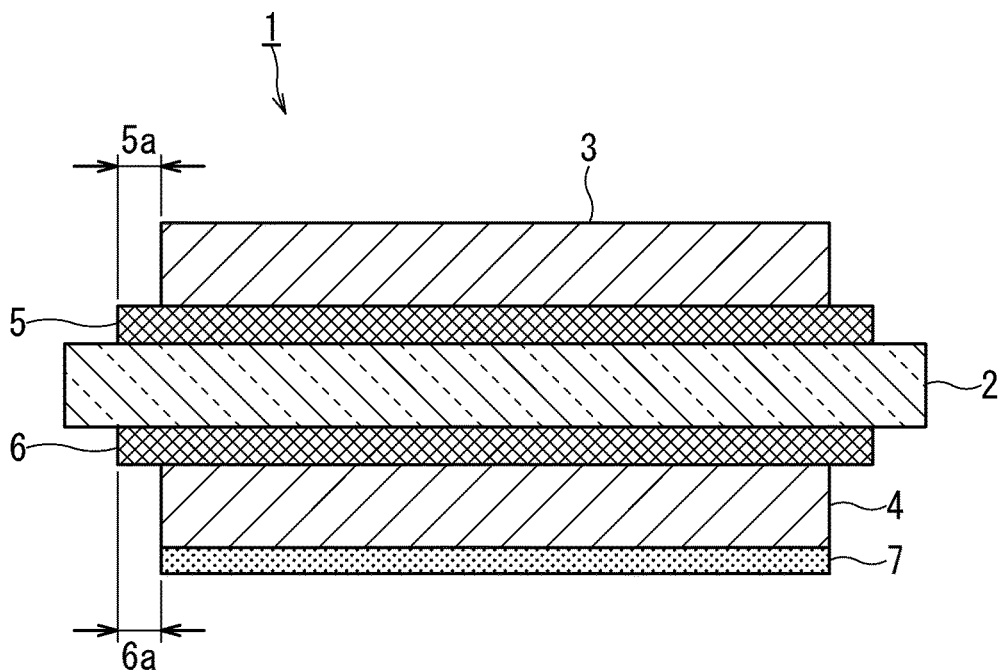
FIG. 1 is a cross-sectional view illustrating a configuration of a ceramic metal circuit substrate according to one embodiment.

FIG. 1 illustrates a configuration of a ceramic metal circuit board according to one embodiment. In FIG. 1, the reference sign 1 denotes a ceramic metal circuit board, the numeral 2 denotes a ceramic substrate, the numeral 3 denotes a metal plate (front metal plate), the numeral 4 denotes a metal plate (rear metal plate), the numeral 5 denotes a bonding layer (front-side bonding layer), the numeral 6 denotes a bonding layer (rear-side bonding layer), and the numeral 7 denotes a metal film (rear-side metal film). In addition, protruding portions 5a and 6a are formed as the portions of the respective bonding layers 5 and 6 such that the bonding layers 5 and 6 protrude from the side surfaces of the respective metal plates 3 and 4.

It is preferable that the ceramic substrate 2 is one of a silicon nitride substrate, an aluminum nitride substrate, and an aluminum oxide substrate. In addition, the thickness of the substrate is preferably in the range of 0.10 to 1.00 mm. When the substrate thickness is less than 0.10 mm, there is a possibility that strength and insulation property of the substrate are deteriorated. Conversely, when the thickness of the substrate exceeds 1.00 mm, the thermal resistance increases and the heat dissipation property will be decreased.

A silicon nitride substrate is mainly composed of silicon nitride ($Si_3N_4$). A silicon nitride substrate preferably has thermal conductivity of 50 W/m·K or more and three-point bending strength of 600 MPa or more. In addition, by increasing three-point bending strength, thickness of a silicon nitride substrate can be reduced to be 0.40 mm or less, and further reduced to be 0.30 mm or less. Since a silicon nitride substrate has a high strength, its heat-cycle resistance characteristics (TCT characteristics) can be improved even in the case of being formed as a thin substrate. Further, by reducing the thickness of the silicon nitride substrate, thermal resistance as a ceramic metal circuit board can be reduced. As long as it is a high-strength ceramic substrate, it is also possible to achieve a mounting structure in which stress is directly applied to the ceramic substrate, such as a screwing structure.

An aluminum nitride substrate is a substrate containing aluminum nitride (AlN) as a main component. In case of the aluminum nitride substrate, it is preferable to use a substrate having a high thermal conductivity of 170 W/m·K or more. Although an aluminum nitride substrate generally has a high thermal conductivity, its three-point bending strength is as low as 550 MPa or less. Further, the average three-point bending strength of an aluminum nitride substrate is 200 to 400 MPa. Thus, it is preferable that thickness of an aluminum nitride substrate is as thick as 0.50 mm or more.

An aluminum oxide substrate is a substrate containing aluminum oxide ($Al_2O_3$) as a main component. An aluminum oxide substrate has a thermal conductivity of 10 to 30 W/m·K and three-point bending strength of 300 to 450 MPa. An aluminum oxide substrate is inexpensive compared with a silicon nitride substrate and an aluminum nitride substrate. Since strength of an aluminum oxide substrate is not so high, thickness of an aluminum oxide substrate is preferably set to 0.50 mm or more.

The metal plates are preferably made of one material selected from copper, a copper alloy, aluminum, and an aluminum alloy. Copper and aluminum are materials having high thermal conductivity and high electrical conductivity. The thickness of each metal plate is preferably set to 0.20 mm or more. By increasing the thickness of each metal plate, heat dissipation property can be improved. Although the upper limit of the thickness of each metal plate is not particularly limited, the thickness is preferably 5.00 mm or less in view of easiness of processing into a predetermined circuit pattern shape.

The metal plates are bonded to the ceramic substrate through the respective bonding layers. It is preferable that each bonding layer contains at least one material selected from Ag (silver), Cu (copper), and Al (aluminum). It is preferable to use an active metal brazing material for forming each bonding layer. As an active metal, one or more element selected from Ti (titanium), Zr (zirconium), Hf (hafnium), and Si (silicon) are included.

When Ti, Zr, and Hf are used as the active metal, it is preferable to use an active metal brazing material containing Ag and Cu. In this case, Ag, Cu, and an active metal are preferably added to the active metal brazing material in contents of 40 to 80% by mass of Ag, 15 to 50% by mass of Cu, and 0.1 to 6% by mass of active metal, respectively. As necessary, at least one selected from Sn (tin) and In (indium) may be added in contents of 5 to 35% by mass.

Further, when Si is used as the active metal, an active metal brazing material containing Al is preferable. In this case, the active metal brazing material is preferably a brazing material which contains Al and Si in contents of 90 to 99.9% by mass of Al and 0.1 to 10% by mass of Si, respectively. As necessary, at least one selected from Mg (magnesium), Ca (calcium), Sr (strontium), and Ba (barium) may be added in contents of 0.01 to 3% by mass.

As these active metal brazing materials, Ag—Cu—Ti type brazing material is preferable. Ti reacts with a nitride ceramic to form a TiN (titanium nitride) phase, which makes it possible to obtain strong bonding between the ceramic substrate and each metal plate.

In such a ceramic metal circuit board, the present embodiment is characterized in that at least in that (a) a metal film is provided on a surface of one metal plate provided on one surface of the ceramic substrate and (b) at least a part of another metal plate provided on another surface of the ceramic substrate is not provided with the metal film.

In the ceramic metal circuit board 1 shown in FIG. 1, any metal film is not provided on the surface of the front metal plate 3. Conversely, a metal film 7 is provided on the surface of the rear metal plate 4. The metal film 7 is preferably nickel (Ni), gold (Au), or an alloy containing nickel or gold as main components. The example of Ni alloy may include, e.g., an Ni—P (phosphorus) alloy and an Ni—B (boron) alloy. Ni and Au have satisfactory wettability with grease. Thus, when the metal film 7 is integrated with a heat dissipation member through grease, it is possible to suppress formation of bubbles which reduces heat dissipation property in the grease layer.

The rear-side metal plate is preferably provided with a metal film which has a linear expansion coefficient smaller than the linear expansion coefficient of the rear-side metal plate. By providing a metal film having a smaller linear expansion coefficient than that of a metal plate, it is possible to make the rear-side metal plate slightly convex. As to a linear thermal expansion coefficient, copper (Cu) is 16.8 ppm/K, aluminum (Al) is 23 ppm/K, nickel (Ni) is 12.8 ppm/K, and gold (Au) is 14.3 ppm/K.

Figure 7:
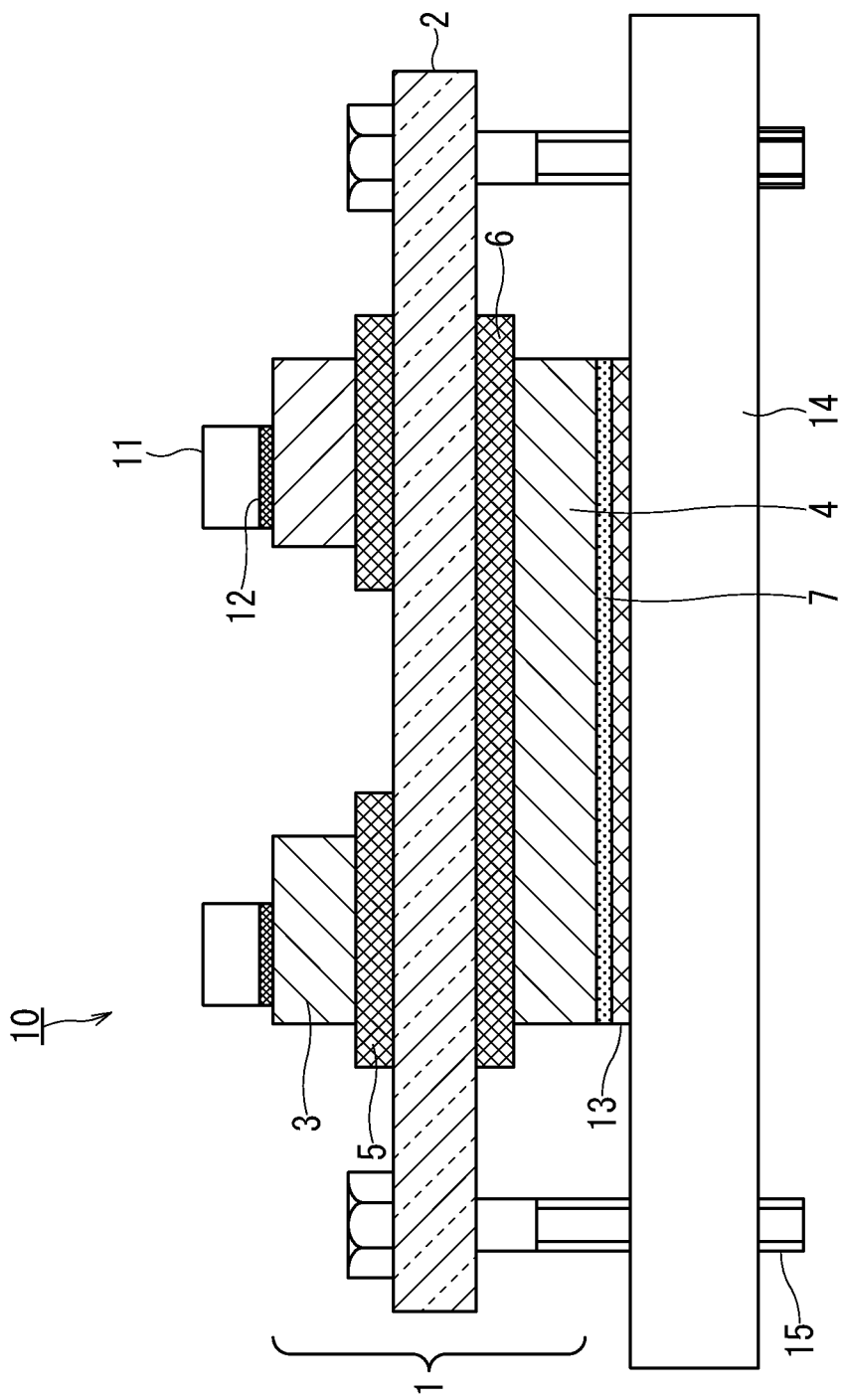
FIG. 7 is a cross-sectional view illustrating a configuration of a semiconductor device according to still another embodiment.

For instance, when a Ni film is provided on the surface of the rear-side copper plate, the surface of the rear-side copper plate tends to become convex as the linear expansion coefficient of Ni is smaller than that of the front-side copper plate which is not provided with the Ni film. This structure enables such a mounting so that grease uniformly expands outward, when a mounting structure in which a stress directly applied to the ceramic substrate is taken as shown in FIG. 7 to be described below. This structure can reduce formation of bubbles in the grease layer. From this point as well, it is preferable to provide a metal film mainly composed of Ni or Au on a copper plate or an aluminum plate. This is a synergistic effect utilizing the satisfactory wettability between the metal film and the grease and the difference in linear expansion coefficient between the metal plate and the metal film.

Since Ni and Au have high corrosion resistance, rusting of each metal plate can be prevented. The rust of each metal plate is mainly composed of oxide. Since these rusts act as thermal resistors, it is preferable to prevent generation of these rusts.

Figure 4:
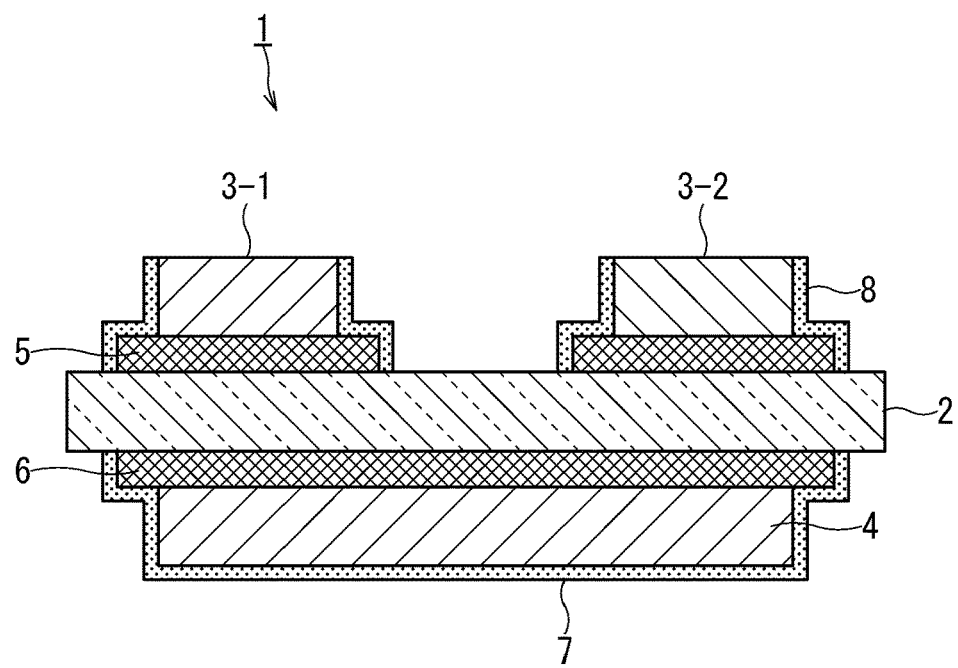
FIG. 4 is a cross-sectional view illustrating a configuration of yet another embodiment in which two front metal plates are disposed in a ceramic metal circuit board.

Further, the average thickness of the metal film is preferably 10 μm or less. Even when the metal film is formed to be excessively thick, further effects cannot be obtained. When plural metal plates are bonded as shown in FIG. 4, there is a possibility that adjacent metal plates are electrically connected to each other. Thus, the average thickness of the metal film is preferably 10 μm or less, more preferably 5 μm or less.

Measurement of the film thickness of the metal film is performed by measuring thickness values at arbitrary three positions and setting the average of the three measured thickness values as the average film thickness. When the metal film is provided on the side surface of the metal plate as described later, the thickness in the side direction is measured. The metal film formation method in the present embodiment is not limited to particular methods such as a plating method and a sputtering method.

Further, it is preferable that the metal plate provided with the metal film has a recrystallized structure. Copper (or copper alloy) or aluminum (or aluminum alloy) is used for the constituent material of the metal plate as described above. The bonding temperature for bonding the ceramic substrate and the metal plate is as high as 600 to 900° C. The recrystallization temperature of copper is approximately 220° C., and the recrystallization temperature of aluminum is approximately 200° C. For this reason, a copper plate and an aluminum plate have a recrystallized structure after being bonded to the ceramic substrate.

A recrystallized structure includes primary recrystallization and secondary recrystallization. Primary recrystallization indicates a phenomenon in which a new crystal without strain is formed and the metal plate softens when the metal plate is heated. Secondary recrystallization indicates a phenomenon in which further larger crystal grains are generated after the primary recrystallization. When the metal plate is recrystallized, crystals are precipitated on the surface of the metal plate. When crystals are precipitated, irregularities are formed at crystal grains and grain boundaries. In particular, since the secondary recrystallized grains are large, the irregularities of grain boundaries also become large. When a metal film is provided on a surface of a metal plate which has a recrystallized structure, irregularities caused due to the recrystallized structure can be eliminated.

When the bonding method with a high bonding temperature is used as described above, secondary recrystallization occurs on the copper plate and the aluminum plate. The secondary recrystallized grains have an average grain size of 200 to 1000 μm. When the grain size is large to such a degree, the maximum height surface roughness Rz of the metal plate surface becomes 2 μm or more, further 4 μm or more. By providing the metal film on the metal plate surface, the maximum height surface roughness Rz can be reduced to be 1.5 μm or less, further 0.8 μm or less. By reducing the maximum height surface roughness Rz, it is possible to improve the close-contacting property with the heat dissipation member.

Figure 5:
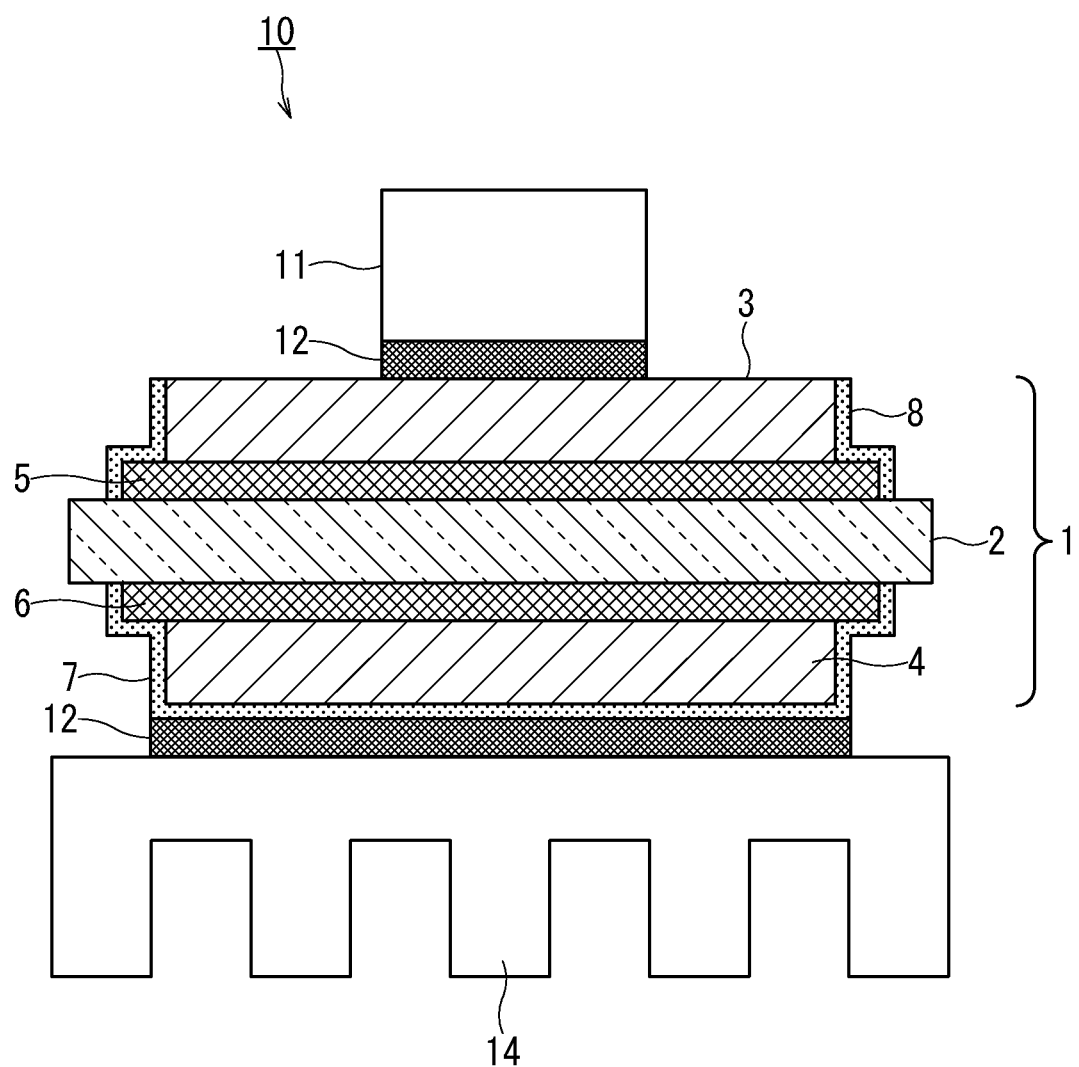
FIG. 5 is a cross-sectional view illustrating a configuration of a semiconductor device according to one embodiment.
Figure 6:
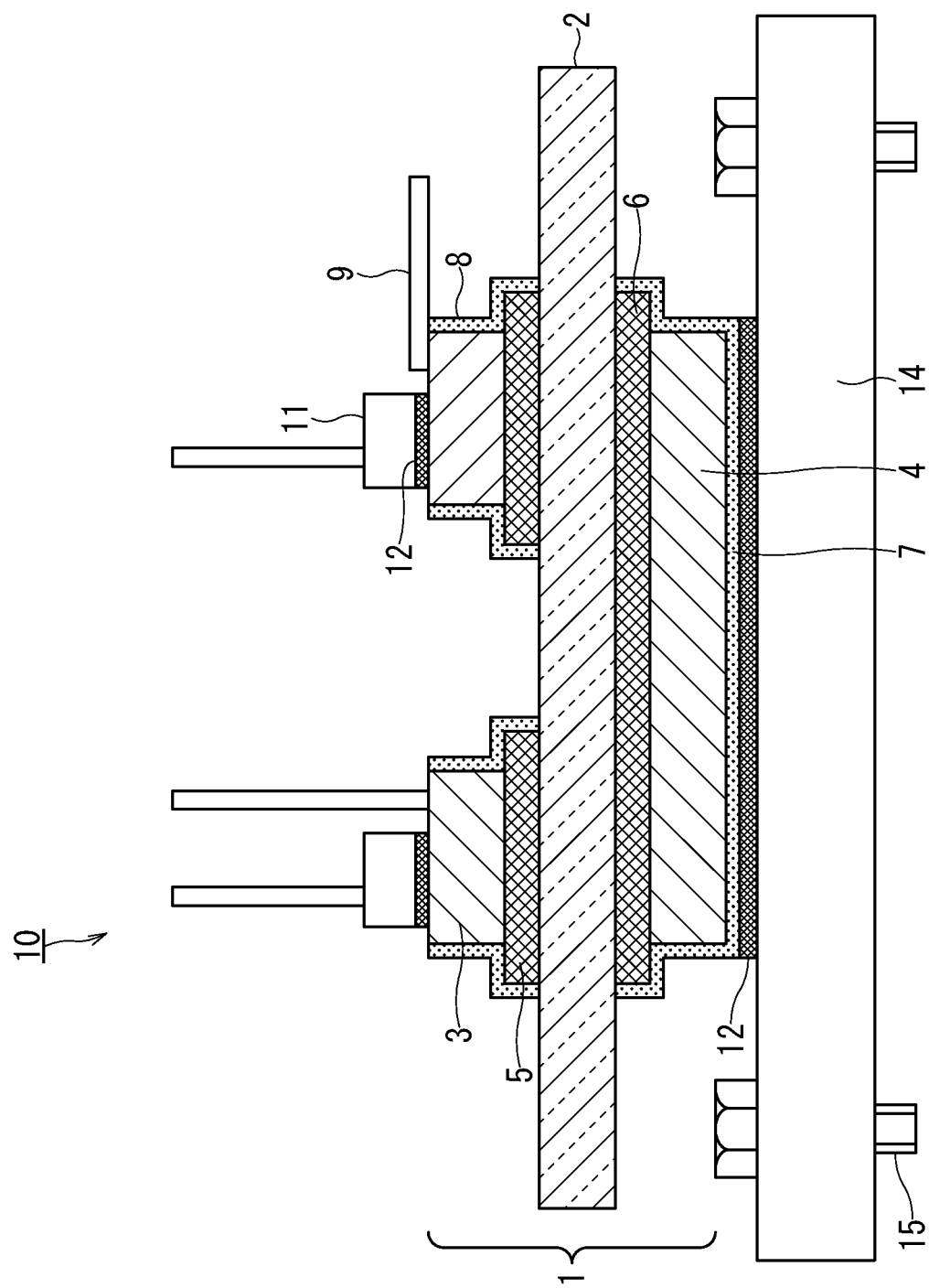
FIG. 6 is a cross-sectional view illustrating a configuration of a semiconductor device according to another embodiment.

As shown in FIG. 5 to FIG. 7, the rear-side metal plate 4 is mounted on a heat dissipation member such as a heat dissipation fin 14. When there are irregularities on the surface of the rear-side metal plate 4, a small gap is formed between the rear-side metal plate 4 and the heat dissipation member 14 so that the adhesion (close-contacting property) is lowered. By providing the metal film 7 on the surface of the rear-side metal plate 4, it is possible to make the surface of the rear-side metal plate 4 a flat surface. Thus, adhesion with the heat dissipation member 14 can be improved. In addition, improvement in adhesion leads to reduction of contact thermal resistance.

In the method of measuring the average crystal grain size of the metal plates 3 and 4, the surface of each of the metal plates 3 and 4 is photographed by means of an optical microscope. In this case, measurement is performed at a magnification of 20 times or more. It is assumed to measure the length corresponding to 5 mm and obtain the average crystal grain size by the line intercept method. The average value of these three arbitrary positions (length 5 mm×3 positions=equivalent to 15 mm) subjected to the above measurement is taken as the average crystal grain size of the metal plates. When the metal plates 3 and 4 are copper plates (including copper alloy plates) or aluminum plates (including aluminum alloy plates) and the average crystal grain size reaches 200 μm or more, it may be determined that secondary recrystallization occurs on the metal plates 3 and 4.

In addition, improvement in adhesion leading to reduction in thermal resistance also leads to improvement in power cycle characteristics of a semiconductor device.

Further, a portion where no metal film is provided is formed on the surface of the front metal plate 3. The portion where the metal film is not provided is used as a portion where a semiconductor element or a metal terminal is mounted as described below. In other words, since it is enough that a metal film is not provided at the portion where the semiconductor element 11 or the metal terminal 9 is mounted, while a metal film may be provided or may not be provided at a portion which is not used for mounting.

Since the portions where the metal film 7 is provided are different between the front metal plate 3 and the rear metal plate 4, the front and rear surfaces can be distinguished from the appearance, and thus the handling property of the ceramic metal circuit board can be improved.

It is also preferable that the protruding portions 5a and 6a protruding from the respective side surfaces of the metal plates 3 and 4 are formed as end portions of the respective bonding layers 5 and 6. The protruding portions 5a and 6a of the bonding layers 5 and 6 are portions which protrude from the respective side surfaces of the metal plates 5 and 6. The presence of the protruding portions 5a and 6a can relieve the stress caused at the bonding end portion between the ceramic substrate 2 and the metal plates 3 and 4. Thus, it becomes possible to improve the heat-cycle resistance characteristics.

The length of each of the protruding portions 5a and 6a is preferably set to within a range of 0.005 to 0.3 mm (i.e., 5 to 300 μm). When the length of each of the protruding portion 5a and 6a is less than 0.005 mm (i.e., 5 μm), the effect of providing the protruding portions 5a and 6a cannot be sufficiently obtained. Conversely, when the length of each of protruding portions 5a and 6a exceeds 0.3 mm (i.e., 300 μm), it also suffers from circuit design restrictions such as increasing the gap between adjacent metal plates, in addition to that further effects cannot be obtained. Thus, the length of each of the protruding portions 5a and 6a is preferably set within the range of 0.005 to 0.3 mm, more preferably within the range of 0.01 to 0.1 mm. Additionally, the protruding portions 5a and 6a may be shaped so as to climb up to the respective side surfaces of the metal plates 3 and 4.

Figure 2:
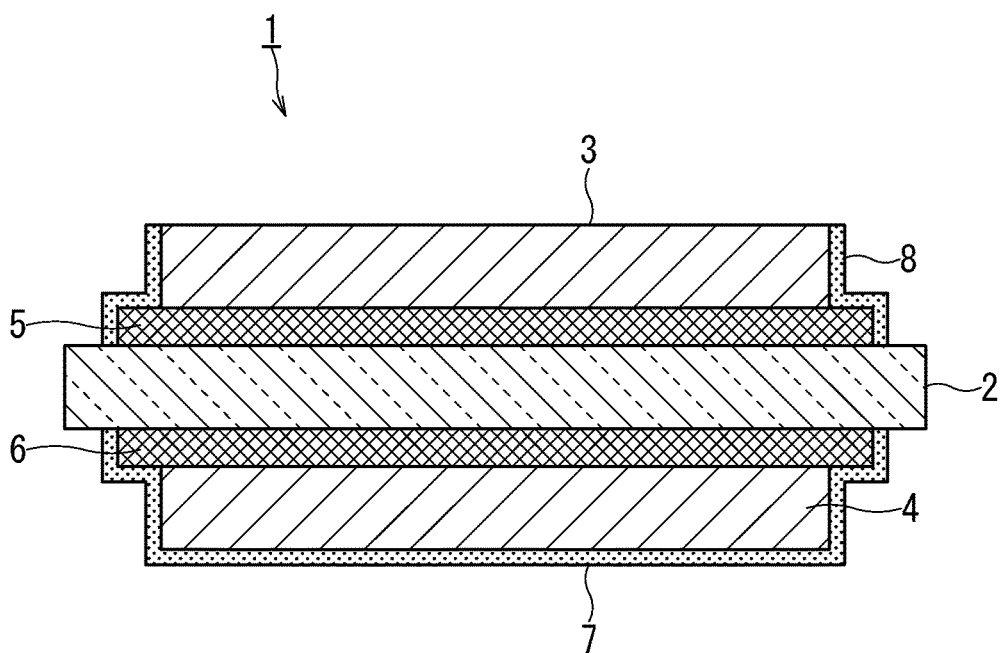
FIG. 2 is a cross-sectional view illustrating a configuration of the ceramic metal circuit board according to another embodiment.

Moreover, it is preferable that respective metal films are provided so as to cover the side surfaces and the protruding portions of the respective metal plates 3 and 4. FIG. 2 illustrates a ceramic metal circuit board in which metal films 7 and 8 are provided so as to cover the side surfaces and protruding portions of the respective metal plates 3 and 4. In FIG. 2, the reference sign 1 denotes a ceramic metal circuit board, the sign 2 denotes a ceramic substrate, the sign 3 denotes a metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), and the sign 8 denotes a metal film (front-side-surface side metal film). In FIG. 2, the rear-side metal film 7 is provided so as to cover the rear surface and the side surface of the rear metal plate 4 and the protruding portion 6a of the bonding layer 6. In addition, the front-side-surface side metal film 8 is provided so as to cover the side surface of the front metal plate 3 and the protruding portion 5a of the bonding layer 5.

By covering the protruding portions 5a and 6a of the respective bonding layers 5 and 6 with the metal films 7 and 8, it is possible to prevent the protruding portions 5a and 6a from being corroded. The ceramic metal circuit board according to each embodiment becomes a semiconductor device by mounting a semiconductor element thereon. A semiconductor device is incorporated in a power module such as an inverter. Inverters are used in motor control devices and power supply control devices of equipment such as elevators, automobiles, railway vehicles, pumps, machine tools, and transportation devices.

For instance, in hybrid vehicles, sulfur components such as $SO_2$ are contained in exhaust gas. When an Ag—Cu—Ti type brazing material is used for the bonding layer as described above, Ag (silver) and S (sulfur) may react to form a reactant such as AgS. In other words, when the ceramic metal circuit board of each embodiment is brought into contact with the exhaust gas for a long period of time, the reactant (such as AgS) is accumulated in the protruding portions of the bonding layers. When reactants are deposited at a portion between adjacent patterns of the metal plates and/or on a creeping surface of the ceramic substrate or separates from the pattern and/or the creeping surface, it causes an electrical conduction and leads to insulation failure. Such a phenomenon is likely to occur in the case of a material which contains a large amount of Ag as like in Ag—Cu—Ti type brazing material.

In the ceramic metal circuit boards according to each of the above described embodiments, the protruding portions of the respective bonding layers are covered with the metal films, and thus reaction with the sulfur component can be prevented. Since the reaction can be prevented while the protruding portions of the respective bonding layers are provided, a structure resistant to corrosion can be achieved while the heat cycle resistance characteristics are improved. In particular, since a ceramic metal circuit board is continued to be used for a long term of 10 years or more in a hybrid car, it is an effective structure to cover a protruding portion of a bonding layer with a metal film. In other words, the ceramic metal circuit board of each of the above-described embodiments is suitable as a circuit board used for a vehicle or equipment which exhausts exhaust gas.

Further, by covering the protruding portions of the respective bonding layers 5 and 6 with the metal films, it is possible to improve the heat cycle resistance characteristics (TCT characteristics). Performance of semiconductor devices has been advanced and improved. As a result, the junction temperature rises. In a SiC element, the junction temperature reaches 150° C. or higher. When a semiconductor device is exposed to a high-temperature environment for a long time, there is a possibility that a protruding portion of each bonding layer is disadvantageously deformed. However, by covering the respective protruding portions 5a and 6a with the metal films, deformation of the protruding portions 5a and 6a can be suppressed. In particular, in the bonding layer containing a soft metal such as Ag, Cu, and Al, there is a high possibility that the protruding portions are deformed. However, when the respective protruding portions 5a and 6a are covered with the metal films, such deformation of the protruding portions 5a and 6a can be effectively suppressed. Thus, the TCT characteristics of the circuit board can be drastically improved.

In addition, since deformation of the protruding portions 5a and 6a can be prevented, electrical conduction failure between the adjacent patterns can be also prevented.

Figure 3:
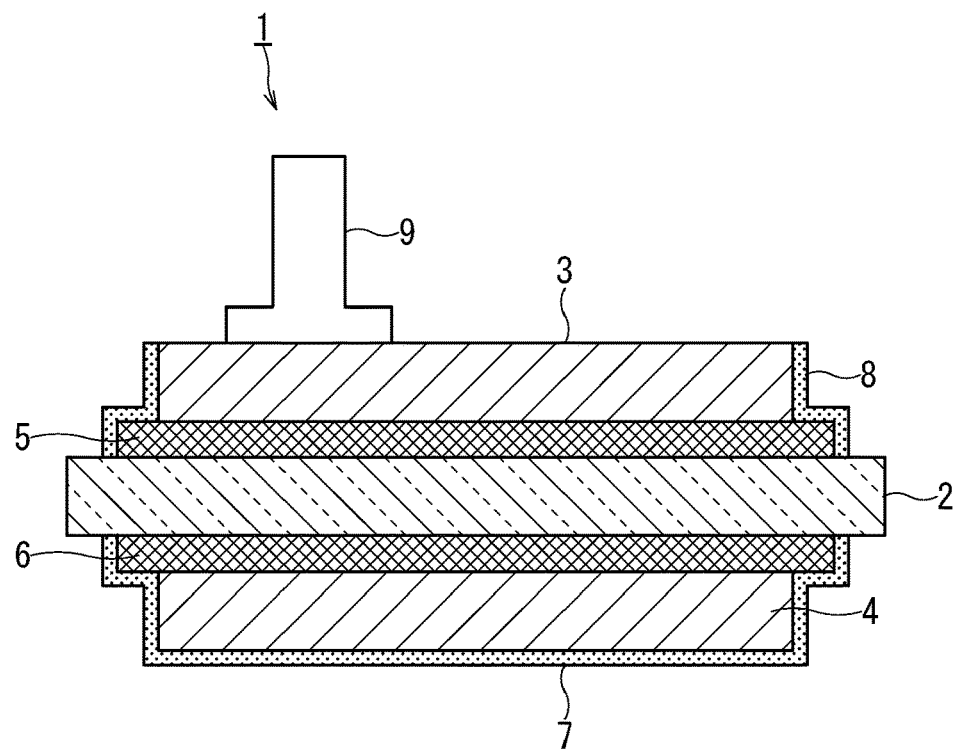
FIG. 3 is a cross-sectional view illustrating a configuration of still another embodiment in which a metal terminal is bonded to a front metal plate of a ceramic metal circuit board.

Further, a metal terminal may be bonded to the portion of the metal plate surface where the metal film is not provided. FIG. 3 illustrates a configuration of a ceramic metal circuit board in which a metal terminal 9 is bonded. In FIG. 3, the reference sign 1 denotes a ceramic metal circuit board, the sign 2 denotes a ceramic substrate, the sign 3 denotes a metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), the sign 8 denotes a metal film (front-side-surface side metal film), and the sign 9 denotes a metal terminal.

The metal terminal 9 is preferably made of one selected from copper, a copper alloy, aluminum, an aluminum alloy, iron, and an iron alloy. The metal terminal 9 is connected to the surface of the front metal plate 3. For bonding the metal terminal 9 to the front metal plate 3, methods such as a soldering method, an ultrasonic bonding method, and a pressure bonding method can be applied.

In addition, there can be made a structure in which a plurality of front metal plates may be bonded together. FIG. 4 illustrates a configuration of a ceramic metal circuit board of still another embodiment in which the plural front metal plates are bonded. In FIG. 4, the reference sign 1 denotes a ceramic metal circuit board, the sign 2 denotes a ceramic substrate, the sign 3-1 denotes a first metal plate (front metal plate), the sign 3-2 denotes a second metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), and the sign 8 denotes a metal film (front-side-surface side metal film). FIG. 4 illustrates a configuration in which two front metal plates 3-1 and 3-2 are disposed. The number of the front metal plates (3-1, 3-2) of the ceramic metal circuit board 1 according to this embodiment is not limited to two but may be increased to a necessary number.

Further, even in a configuration in which the plural front metal plates are provided, it is preferable to provide metal films which cover respective bonding layers and protruding portions thereof. Such a configuration makes it possible to prevent corrosion of the protruding portion of each bonding layer, and thus it is possible to form a portion where distance between adjacent metal plates is narrowed to be 0.3 to 1.0 mm. This configuration indicates that the degree of freedom of circuit design increases.

The above-described ceramic metal circuit board 1 is effective for a semiconductor device in which a semiconductor element is mounted. In addition, it is preferable that the semiconductor element is mounted through a solder layer at such a portion that a metal film is not provided on the surface of the metal plate. Further, it is also preferable that the solder layer is made of lead-free solder.

FIG. 5 illustrates a configuration of a semiconductor device according to one embodiment. In FIG. 5, the reference sign 1 denotes a ceramic metal circuit board, the sign 2 denotes a ceramic substrate, the sign 3 denotes a metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), the sign 8 denotes a metal film (front-side-surface side metal film), the sign 10 denotes a semiconductor device, the sign 11 denotes a semiconductor element, the sign 12 denotes a solder layer, and the sign 14 denotes a heat dissipation fin.

In FIG. 5, the semiconductor element 11 is mounted on the front metal plate 3 through the solder layer 12. The solder layer 12 is provided on the portion of the front metal plate 3 where the metal film is not provided. Further, it is preferable that the solder layer 12 is made of lead-free solder.

FIG. 6 illustrates a configuration of a semiconductor device according to another embodiment. In FIG. 6, the reference sign 1 denotes a ceramic metal circuit board, the sign 2 denotes a ceramic substrate, the sign 3 denotes a metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), the sign 8 denotes a metal film (front-side-surface side metal film), the sign 9 denotes a metal terminal, the sign 10 denotes a semiconductor device, the sign 11 denotes a semiconductor element, the sign 12 denotes a solder layer, the sign 14 denotes a heat dissipation fin, and the sign 15 denotes a screw.

FIG. 6 illustrates the semiconductor device 10 in which the respective semiconductor elements 11 are mounted on the two metal plates 3 through the respective solder layers 12. In this configuration, the metal terminal 9 is used for electrical conduction to the semiconductor element 11 and the heat dissipation fin 14 is fixed with the screws 15.

A method of making the electrical conduction to the semiconductor element 11 is not limited to the method of using the metal terminal 9 as shown in FIG. 6, and wire bonding method may be also used instead.

FIG. 7 illustrates still another configuration of a semiconductor device. In FIG. 7, the reference sign 1 denotes a ceramic metal circuit board, the sign 2 denotes a ceramic substrate, the sign 3 denotes a metal plate (front metal plate), the sign 4 denotes a metal plate (rear metal plate), the sign 5 denotes a bonding layer (front-side bonding layer), the sign 6 denotes a bonding layer (rear-side bonding layer), the sign 7 denotes a metal film (rear-side metal film), the sign 10 denotes a semiconductor device, the sign 11 denotes a semiconductor element, the sign 12 denotes a solder layer, the sign 13 denotes a grease layer, the sign 14 denotes a heat dissipation fin, and the sign 15 denotes a screw.

FIG. 7 illustrates a configuration in which the ceramic substrate 2 is screwed to the heat dissipation fin 14 and is provided with screw-fixing holes. As a screwing structure of the ceramic substrate 2, there is also a method of fixing the ceramic substrate with a fastener and screwing the fastener to the ceramic substrate.

The above-described lead-free solder is exemplified in JIS-Z-3282 (2006). The lead-free solder contains Sn (tin) as a main component. The term "main component" as used herein means a component which is included most in the solder components by mass %. For lead-free solder, additives are adjusted to select characteristics such as high temperature type, medium high temperature type, and medium temperature type. Although the lead-free solder contains Ag in contents of 5% or less by mass, the lead-free solder also contains much Sn which is hard to react with a sulfur component and thus no reactant (AgS) is produced. The semiconductor device according to each embodiment is not limited to a type in which lead-free solder is used for bonding, and various bonding materials may be also used. Lead-based solders are also included in these various bonding materials to be used for the semiconductor device of each embodiment.

Further, the rear metal plate 4 is bonded to the heat dissipation fin 14 through the solder layer 12 or the grease layer 13. Although the semiconductor device 10 with the heat dissipation fin 14 is illustrated in FIG. 5, various heat dissipating members such as a heat dissipation plate (heat sink) and a casing can be also used instead of the heat dissipation fin 14. Instead of the grease layer 13, a solder layer and an adhesive layer may be also used. As necessary, a screwing structure or a pressure-contacting structure is used.

In addition, constituent materials of the heat dissipation member include copper, a copper alloy, aluminum, an aluminum alloy, iron, an iron alloy, and ceramics. Further, as necessary, the semiconductor device 10 is resin-molded.

In the case of adopting a structure in which the assembly of respective components is mounted on the heat dissipation fin 14 through the grease layer 13 as shown in FIG. 7, it is possible to suppress formation of bubbles in the grease layer 13 by providing the metal film 7 on the surface of the rear metal plate 4. Reduction of air bubbles (voids) and improvement in adhesion lead to reduction in thermal resistance and resulting in further improvement in heat dissipation. This improvement in heat dissipation further leads to improvement in power cycle characteristics of the semiconductor device.

Here, a power cycle characteristic test is a durability test in which a switching operation is repeatedly performed under the state where temperature of a semiconductor device is relatively stable. This is a test to reproduce a failure mode performed while ON/OFF of the semiconductor element is repeated. When the heat dissipation property is unsatisfactory, the heat of the semiconductor element does not sufficiently escape and thus a bonding failure is likely to occur. When the semiconductor element is a power element, it is sometimes called a disconnection energization test.

Next, a description will be given of a method of manufacturing the ceramic metal circuit board and the semiconductor device according to the above-described embodiments. The method of manufacturing the ceramic metal circuit board according to each embodiment is not particularly limited, but the following procedure can be adopted as a method for efficiently producing it.

First, a ceramic substrate is prepared. As the ceramic substrate, any one of a silicon nitride substrate, an aluminum nitride substrate, and an aluminum oxide substrate is preferable. The silicon nitride substrate, the aluminum nitride substrate, and the aluminum oxide substrate are preferably the substrates as described hereinbefore. In addition, the thickness of the substrate is preferably set within a range of 0.1 to 1.0 mm. Further, the substrate thickness is selected depending on required strength and thermal conductivity of the substrate.

Next, a metal plate is prepared. It is preferable that the metal plate is one selected from copper, a copper alloy, aluminum, and an aluminum alloy. The thickness of the metal plate is preferably set within a range of 0.2 to 5.0 mm.

Next, an active metal brazing material is prepared. It is preferable that the active metal is one selected from Ti, Zr, Hf, and Si.

When the metal plate is a copper plate or a copper alloy plate, it is preferable to use an active metal brazing material which contains Ag and Cu and further contains one of active metals selected from Ti, Zr, and Hf. As necessary, one or both of Sn and In are contained in the active metal brazing material.

When the metal plate is an aluminum plate or an aluminum alloy plate, it is preferable to use an active metal brazing material which contains Si and Al. As necessary, one or more elements selected from Mg, Ca, Sr, and Ba are contained in the active metal brazing material.

A binder is mixed with the active metal brazing material to prepare an active metal brazing material paste. The active metal brazing material paste is applied on the ceramic substrate, and then the metal plate is placed on the ceramic substrate. The active metal brazing material paste may be coated on the entire surface of the ceramic substrate or be partially coated in a predetermined pattern shape. Further, the metal plate may be a single plate or plural divided plates which have been preliminarily processed into predetermined pattern shapes. When a single plate is bonded, then the single plate is formed into a predetermined pattern shape by etching processing.

Methods for forming the protruding portion of each bonding layer include a method of widely coating the coating region of the active metal brazing material paste in consideration of the protruding portions in advance. As another method, an end portion of the metal plate after bonding is etched so as to form a protruding portion while leaving the bonding layer at the end portion. By this process, respective metal plates are bonded to both surfaces of the ceramic substrate.

Next, a process of providing each metal film is performed. It is preferable that each metal film contains Ni or Au as a main component. Further, it is preferable that the average thickness of each metal film is 10 μm or less, more preferably 5 μm or less.

Moreover, a mask material is provided to a portion where a metal film is not desired. As the mask material, an etching resist or a plating resist is preferably used. By using an etching resist, it is also possible to perform a step of providing a metal film after performing a step of etching the side surface of the metal plate. It is also preferable to perform the step of providing the metal film from either the rear surface or the front surface. Additionally or alternatively, after the metal film is provided, the metal film may be removed by treatment such as a chemical solution washing or polishing. Through this process, a ceramic metal circuit board provided with a metal film can be manufactured.

Next, the step of mounting the semiconductor element is performed. First, a solder layer is provided on the surface of the front metal plate where the metal film is not provided. Thereafter, the semiconductor element is placed on the solder layer and bonded by heat treatment.

It is preferable that the solder layer is made of lead-free solder. As the lead-free solder, it is preferable to use solder shown in JIS-Z-3282. The lead-free solder shown in JIS-Z-3282 contains Ag in contents of 5.2% or less by mass. Since Ag content is 10% or less by mass, Ag is hardly exposed on the surface of the solder layer. Thus, a reactant with the sulfur component is hardly formed.

In the case of modularizing the ceramic metal circuit board, the rear metal plate 4 with the rear metal plate coating 7 formed thereon is mounted on the heat dissipation member through the grease layer 13. Instead of the grease layer, a solder layer or an adhesive layer may be used. As necessary, a screwing fastening structure and/or a pressure contacting structure may be used. Since the rear metal plate 4 is provided with the rear metal film 7, the rear metal plate 4 has satisfactory adhesion property with the grease layer, the solder layer, and the adhesive layer.

As the module structure becomes more complicated, there are cases where a mounting step of a semiconductor element and a mounting step of integrating a ceramic circuit board with a heat dissipation member are separately performed. By providing a metal film on the rear metal plate, it is possible to suppress oxidation of the surface of the rear metal plate due to heat treatment during the semiconductor-element mounting-process. Similarly, when a large number of semiconductor devices are taken out of a large-sized ceramic circuit board, there is also a method of dividing the ceramic circuit board after mounting semiconductor elements in advance.

The above-described method is effective for a ceramic circuit board which is used for performing a step of mounting a semiconductor element first and then mounting this assembly including the semiconductor element on the heat dissipating member.

EXAMPLES (Examples 1 to 10 and Comparative Examples 1 and 2) Each sample shown in Table 1 was prepared as a constituent material of a ceramic metal circuit board. For the silicon nitride substrate, a substrate having thermal conductivity of 90 W/m·K and three-point bending strength of 650 MPa was used. For the AlN (aluminum nitride) substrate, a substrate having thermal conductivity of 180 W/m·K and three-point bending strength of 350 MPa was used. For the alumina (aluminum oxide) substrate, a substrate having thermal conductivity of 20 W/m·K and three-point bending strength of 400 MPa was used. For the Al—Zr substrate (composed of 20 wt % of $ZrO_2$ and 80 wt % of $Al_2O_3$), a substrate having thermal conductivity of 25 W/m·K and three-point bending strength of 450 MPa was used.

The "Ag—Cu—Ti" composition of the bonding brazing material consists of 68 wt % of Ag, 30 wt % of Cu, and 2 wt % of Ti. The composition of "Ag—Cu—Sn—Ti" consists of 58 wt % of Ag, 25 wt % of Cu, 14 wt % of Sn, and 3 wt % of Ti. The "Al—Si" composition consists of 99 wt % of Al and 1 wt % of Si. Since these bonding brazing materials contain Ti or Si, they are active-metal bonding brazing materials.

Each bonding brazing material was mixed with a binder to prepare a bonding brazing material paste. The bonding brazing material paste was applied on the ceramic substrate so as to have a thickness of 40 μm, and the metal plate was placed on it. This step was performed on both surfaces of the ceramic substrate, and heat treatment was performed thereby to prepare a ceramic metal circuit board. The heat treatment temperature was 800 to 900° C. for the "Ag—Cu—Ti" brazing material and "Ag—Cu—Sn—Ti" brazing material, and was set within the range of 600 to 800° C. for the "Al—Si" brazing material. The front metal plate was bonded such that the distance between the adjacent metal plates becomes 1 mm.

TABLE 1

| Sample No. | Ceramic Substrate Material | Ceramic Substrate Length × Width × Thickness (mm) | Front Metal Plate Material | Front Metal Plate Length × Width × Thickness (mm) | Rear Metal Plate Material | Rear Metal Plate Length × Width × Thickness (mm) | Bonding Layer Composition of Bonding Brazing Material |
|---|---|---|---|---|---|---|---|
| Sample 1 | Silicon Nitride | 50 × 35 × 0.32 | Cu | 20 × 15 × 0.3 (Two Samples) | Cu | 30 × 20 × 0.3 | Ag—Cu—Ti |
| Sample 2 | Silicon Nitride | 50 × 35 × 0.32 | Cu | 35 × 15 × 0.5 (Two Samples) | Cu | 35 × 25 × 0.5 | Ag—Cu—Sn—Ti |
| Sample 3 | Silicon Nitride | 50 × 35 × 0.25 | Cu | 30 × 15 × 0.8 (Two Samples) | Cu | 30 × 25 × 0.8 | Ag—Cu—Sn—Ti |
| Sample 4 | AlN | 50 × 35 × 0.635 | Al | 30 × 15 × 0.3 (Two Samples) | Al | 30 × 20 × 0.3 | Al—Si |
| Sample 5 | Alumina | 50 × 35 × 0.635 | Cu | 30 × 15 × 0.33 (Two Samples) | Cu | 30 × 20 × 0.3 | Ag—Cu—Sn—Ti |
| Sample 6 | AL—Zr | 50 × 35 × 0.635 | Cu | 30 × 15 × 0.3 (Two Samples) | Cu | 30 × 20 × 0.3 | Ag—Cu—Sn—Ti |

Next, plating treatment was performed on each ceramic metal circuit board (samples 1 to 6), and a metal film was provided at a predetermined portion. In this manner, the ceramic metal circuit boards of the respective Examples 1 to 10 shown in Table 2 were prepared. In the Comparative Example 1, the Sample 1 was used as it was (no metal film was provided at all). In the Comparative Example 2, a metal film was provided on the respective surfaces of the front and rear metal plates. As to the metal plate provided with a metal film on its side surface, the metal film is provided so as to cover the protruding portion of the bonding layer.

In addition, the maximum height surface roughness Rz of the surface provided with the metal film was determined. Rz was measured according to JIS-B-0601.

TABLE 2

| | Sample | Protruding Portion of Bonding Layer (μm) | Metal Film Material | Front Metal Plate Front Surface | Front Metal Plate Side Surface | Rear Metal Plate Front Surface | Rear Metal Plate Side Surface | Maximum Height Surface Roughness Rz (μm) |
|---|---|---|---|---|---|---|---|---|
| Example 1 | Sample 1 | 20 | Ni | None | None | Presented | Presented | 1.2 |
| Example 2 | Sample 1 | 30 | Ni—P | None | Presented | Presented | Presented | 0.8 |
| Example 3 | Sample 1 | 30 | Au | None | Presented | Presented | Presented | 0.5 |
| Example 4 | Sample 2 | 20 | Ni—P | None | Presented | Presented | Presented | 0.9 |
| Example 5 | Sample 2 | 30 | Au | None | Presented | Presented | Presented | 0.6 |
| Example 6 | Sample 3 | 20 | Ni—P | None | Presented | Presented | Presented | 0.8 |
| Example 7 | Sample 3 | 30 | Au | None | Presented | Presented | Presented | 0.5 |

TABLE 2-continued

| | Sample | Protruding Portion of Bonding Layer (μm) | Material | Metal Film | | | | Maximum Height Surface Roughness Rz (μm) |
| --- | --- | --- | --- | --- | --- | --- | --- | --- |
| | | | | Front Metal Plate | | Rear Metal Plate | | |
| | | | | Front Surface | Side Surface | Front Surface | Side Surface | |
| Example 8 | Sample 4 | 30 | Ni—P | None | Presented | Presented | Presented | 1.0 |
| Example 9 | Sample 5 | 30 | Ni—P | None | Presented | Presented | Presented | 0.9 |
| Example 10 | Sample 6 | 30 | Ni—P | None | Presented | Presented | Presented | 0.9 |
| Comparative Example 1 | Sample 1 | 20 | — | None | None | None | None | 3.5 |
| Comparative Example 2 | Sample 1 | 20 | Ni—P | Presented | None | Presented | None | 4.4 |

Semiconductor elements were mounted on the respective ceramic metal circuit boards according to the above Examples and Comparative Examples. The semiconductor elements were mounted on the respective two front metal plates by using lead-free solder. The thickness of the lead-free solder layer was 50 μm which was common to all the Examples and Comparative Examples. Wire bonding was performed on each semiconductor element thereby to form an electrical conduction circuit.

Next, after carrying out a case-joining operation, a potting gel was filled thereby to prepare a baseless type power module. Next, an Al heat dissipation plate was screwed to the rear metal plate side through a silicone grease layer (thickness: 100 μm). In this manner, inverters (semiconductor devices) were fabricated.

Thermal resistance and TCT characteristics were measured by using the inverters. As to the thermal resistance, each semiconductor element was caused to generate heat (drive) and the thermal resistance (K/W) was measured. Further, in the TCT, the thermal resistance after 1000 cycles was measured with one cycle of holding at a temperature of −40° C. for 30 minutes→25° C. for 10 minutes→175° C. for 30 minutes→25° C. for 10 minutes.

In addition, the defect occurrence rate between the front metal plates (between patterns) after the TCT was measured. TCT were performed on 100 inverters (semiconductor devices) of each of the Examples and Comparative Examples, and the rate of occurrence of conduction failures between patterns was measured for each of the Examples and Comparative Examples.

Presence/absence of deformation of the protruding portion after the TCT was checked by taking a SEM photograph from the top before and after the above TCT. The results are shown in Table 3 below.

TABLE 3

| | Thermal Resistance (K/W) before TCT | Thermal Resistance (K/W) after TCT | Failure Occurrence Rate (%) between Patterns after TCT | Occurrence Rate of Deformation in Protruding Portion after TCT |
| --- | --- | --- | --- | --- |
| Example 1 | 0.23 | 0.27 | 0 | Observed |
| Example 2 | 0.23 | 0.23 | 0 | None |
| Example 3 | 0.23 | 0.23 | 0 | None |
| Example 4 | 0.21 | 0.21 | 0 | None |
| Example 5 | 0.21 | 0.21 | 0 | None |
| Example 6 | 0.18 | 0.18 | 0 | None |
| Example 7 | 0.18 | 0.18 | 0 | None |
| Example 8 | 0.25 | 0.26 | 0 | None |
| Example 9 | 0.38 | 0.40 | 0 | None |
| Example 10 | 0.36 | 0.38 | 0 | None |
| Comparative Example 1 | 0.23 | 0.34 | 12 | Observed |
| Comparative Example 2 | 0.23 | 0.32 | 0 | Observed |

As is clear from the results shown in Table 3, according to the semiconductor device of each Example, change in thermal resistance is small even after the TCT. This is because the TCT characteristics are satisfactory. Further, no defects between patterns occurred at all.

Next, the respective ceramic metal circuit boards of the Examples and Comparative Examples were left in an atmosphere containing $SO_2$ for 100 hours. Thereafter, the same TCT as described above was performed for 1000 cycles, and then the thermal resistance and the failure occurrence rate between patterns were measured. The measurement results are shown in Table 4 hereunder.

TABLE 4

| | After being Left in Atmosphere Containing $SO_2$ | |
| --- | --- | --- |
| | Thermal Resistance (K/W) after TCT | Failure Occurrence Rate (%) between Patterns after TCT |
| Example 1 | 0.45 | 20 |
| Example 2 | 0.23 | 0 |
| Example 3 | 0.23 | 0 |
| Example 4 | 0.21 | 0 |
| Example 5 | 0.21 | 0 |
| Example 6 | 0.18 | 0 |
| Example 7 | 0.18 | 0 |
| Example 8 | 0.26 | 0 |
| Example 9 | 0.40 | 0 |
| Example 10 | 0.38 | 0 |
| Comparative Example 1 | 0.55 | 20 |
| Comparative Example 2 | 0.49 | 20 |

As is clear from the results shown in Table 4 above, in the respective ceramic metal circuit boards of the Examples 2-10, corrosion due to the $SO_2$-containing atmosphere did not occur in the case where the metal film was provided on the side surface, and thus the TCT characteristics were satisfactory and the failure occurrence rate between patterns was zero. Contrastively, in the Example 1, the Comparative Example 1, and the Comparative Example 2, each of which includes a portion where no metal film was provided on the side surface, $SO_2$ reacted with the bonding layer to form AgS. For this reason, it has been confirmed that the ceramic metal circuit board provided with the metal film on the side surface has a strong durability against the corrosion by $SO_2$.

Examples 1A to 10A and Comparative Examples 1A and 2A

The Examples 1A to 10A and the Comparative Examples 1A and 2A are respectively the same as the Examples 1 to 10 and the Comparative Examples 1 and 2 except that the length of the long side of the ceramic substrate was increased by 20 mm. By using the ceramic metal circuit boards of the Examples 1A to 10A and the Comparative Examples 1A and 2A, semiconductor devices were fabricated as shown in FIG. 7 such that each of the semiconductor devices has a screw fastening structure. The screw fastening structure was achieved by providing screw holes in the ceramic substrate 2, directly inserting the screw 15 through the heat dissipation plate (heat dissipation fin 14), and screwing it. A power cycle test was performed on each semiconductor device. The power cycle test was performed under the conditions of temperature 80 to 150° C. ($\Delta T=70°$ C.), and the number of cycles until failure occurrence was measured. The measurement results are shown in Table 5 below. In Table 5, a symbol mark "○" indicates that the number of cycles up to failure occurrence was 100000 or more, a symbol mark "Δ" indicates that the number of cycles up to failure occurrence was 10000 or more and less than 100000 cycles, and a symbol mark "x" indicates that the number of cycles up to failure occurrence was less than 10000 cycles.

TABLE 5

|  | Ceramic Circuit Board | Power Cycle Test |
|---|---|---|
| Example 1A | Example 1 | ○ |
| Example 2A | Example 2 | ○ |
| Example 3A | Example 3 | ○ |
| Example 4A | Example 4 | ○ |
| Example 5A | Example 5 | ○ |
| Example 6A | Example 6 | ○ |
| Example 7A | Example 7 | ○ |
| Example 8A | Example 8 | ○ |
| Example 9A | Example 9 | ○ |
| Example 10A | Example 10 | ○ |
| Comparative Example 1A | Comparative Example 1 | X |
| Comparative Example 2A | Comparative Example 2 | Δ |

As is clear from the results shown in Table 5, the semiconductor devices according to the Examples 1A to 10A were excellent in durability. In particular, it was confirmed that the bonding structure through the grease layer is effective.

Several embodiments of the present invention are illustrated above. However, these embodiments are presented by way of example only and not intended to limit the scope of the invention. These novel embodiments can be implemented in other various forms. Various omissions, substitutions, alterations, and the like of the embodiments can be made without departing from the gist of the invention. These embodiments and modifications thereof are included in the scope and the gist of the invention and included in the inventions described in claims and a scope of equivalents of the inventions. The embodiments described above can be implemented in combination with one another.

REFERENCE SIGNS LIST 1 ceramic metal circuit board
2 ceramic substrate
3 metal plate (front metal plate)
3-1 first metal plate (front metal plate)
3-2 second metal plate (front metal plate)
4 metal plate (rear metal plate)
5 bonding layer (front-side bonding layer)
5a protruding portion of the bonding layer
6 bonding layer (rear-side bonding layer)
6a protruding portion of the bonding layer
7 metal film (rear-side metal film)
8 metal film (front-side-surface side metal film)
9 metal terminal
10 semiconductor device
11 semiconductor element
12 solder layer
13 grease layer
14 heat dissipation fin (heat dissipation member)
15 screw

The invention claimed is:

1. A ceramic metal circuit board comprising:
a ceramic substrate; and
first and second metal plates bonded to first and second opposite surfaces, respectively, of the ceramic substrate through respective bonding layers, the first and second metal plates each being made of a material selected from the group consisting of copper and a copper alloy;
a metal film on a surface of the first metal plate that is opposite the ceramic substrate; and
at least a part of a surface of the second metal plate that is opposite the ceramic substrate is not provided with the metal film; and
a semiconductor element or a metal terminal mounted to the at least a part of the surface of the second metal plate that is provided with no metal film with lead-free solder, wherein:
the maximum height surface roughness Rz of the surface of the first metal plate, the second metal plate, or both, that is provided with the metal film is 1.5 μm or less,
a thickness of the metal film is 10 μm or less on average,
average crystal grain sizes of the first metal plate and the second metal plate each is 200 μm or more, and
one of the metal plates on which the metal film is provided includes a recrystallized structure.

2. The ceramic metal circuit board according to claim 1, wherein a protruding portion is formed as a portion of each of the bonding layers in such a manner that the each of bonding layers protrudes from a side surface of each of the metal plates.

3. The ceramic metal circuit board according to claim 1, wherein the bonding layers contain at least one element selected from Ag, Cu, and Al.

4. The ceramic metal circuit board according to claim 1, wherein the metal film is formed in such a manner that the metal film covers respective side surfaces of the metal plates and the protruding portion.

5. The ceramic metal circuit board according to claim 1, wherein the metal film is one selected from nickel, gold, or an alloy containing the nickel and the gold as main components.

6. The ceramic metal circuit board according to claim 1, wherein the ceramic substrate is one selected from a silicon nitride substrate, an aluminum nitride substrate, and an aluminum oxide substrate.

7. The ceramic metal circuit board according to claim 1, wherein a metal terminal is bonded to such a position on a surface of one metal plate where the metal film is not provided.

8. A semiconductor device which is configured by mounting a semiconductor element on the ceramic metal circuit board according to claim 1.

9. The semiconductor device according to claim 8, wherein the semiconductor element is mounted through a solder layer on a position of a surface of a metal plate where the metal film is not provided.

10. The ceramic metal circuit board according to claim 1, wherein the bonding layers contain at least one selected from Ag, Cu, and Al; and one of the metal plates on which the metal film is provided includes a recrystallized structure.

11. The ceramic metal circuit board according to claim 1, wherein the metal plate is a copper plate.

12. The ceramic metal circuit board according to claim 1, wherein the metal plate has a thickness of 0.20 mm or more.

13. The ceramic metal circuit board according to claim 1, wherein the thickness of the metal film is 5 μm or less on average.

14. The ceramic metal circuit board according to claim 1, wherein the ceramic substrate is one selected from a silicon nitride substrate, the bonding layers contain at least one element selected from Ag, Cu, and Al, and the metal plate is a copper plate.

15. The ceramic metal circuit board according to claim 1, wherein the ceramic substrate is one selected from a silicon nitride substrate, the bonding layers contain at least one element selected from Ag, Cu, and Al, the metal plate is a copper plate, and the metal plate has a thickness of 0.20 mm or more.

16. The semiconductor device according to claim 8, wherein the ceramic substrate is one selected from a silicon nitride substrate, the bonding layers contain at least one element selected from Ag, Cu, and Al, the metal plate is a copper plate, and the metal plate has a thickness of 0.20 mm or more.

* * * * *